United States Patent [19]
Nason et al.

[11] Patent Number: 5,365,876
[45] Date of Patent: Nov. 22, 1994

[54] CRYSTAL FACE TEMPERATURE DETERMINATION MEANS

[75] Inventors: Donald O. Nason, Goleta, Calif.; Arnold Burger, Nashville, Tenn.

[73] Assignee: The United States of America as represented by the United States Department of Energy, Washington, D.C.

[21] Appl. No.: 11,634

[22] Filed: Feb. 1, 1993

[51] Int. Cl.[5] .............................................. C30B 25/16
[52] U.S. Cl. ........................................ 117/85; 117/86; 117/109; 117/940
[58] Field of Search .................. 156/600, 601, 610; 117/85, 86, 109, 940

[56] References Cited

U.S. PATENT DOCUMENTS

| | | | |
|---|---|---|---|
| 3,291,650 | 12/1966 | Dohmen et al. | 156/601 |
| 3,740,563 | 8/1973 | Reichard | 156/601 |
| 4,417,822 | 11/1983 | Stein et al. | 374/129 |
| 4,778,270 | 10/1988 | Kinney et al. | 356/43 |
| 4,823,291 | 4/1989 | Berman | 364/557 |
| 4,830,513 | 5/1989 | Grego | 374/131 |
| 4,919,899 | 4/1990 | Herrmann et al. | 156/601 |
| 4,959,244 | 9/1990 | Penney et al. | 427/53.1 |
| 4,979,134 | 12/1990 | Arima et al. | 364/557 |
| 4,985,858 | 1/1991 | Morrison, Jr. | 364/557 |
| 5,213,985 | 5/1993 | Sandroff et al. | 156/601 |

FOREIGN PATENT DOCUMENTS 253437  1/1989  Germany .................. 156/601

*Primary Examiner*—Robert Kunemund
*Attorney, Agent, or Firm*—Miguel A. Valdes; Roger S. Gaither; William R. Moser

[57] ABSTRACT

An optically transparent furnace (10) having a detection apparatus (29) with a pedestal (12) enclosed in an evacuated ampule (16) for growing a crystal (14) thereon. Temperature differential is provided by a source heater (20), a base heater (24) and a cold finger (26) such that material migrates from a polycrystalline source material (18) to grow the crystal (14). A quartz halogen lamp (32) projects a collimated beam (30) onto the crystal (14) and a reflected beam (34) is analyzed by a double monochromator and photomultiplier detection spectrometer (40) and the detected peak position (48) in the reflected energy spectrum (44) of the reflected beam (34) is interpreted to determine surface temperature of the crystal (14).

7 Claims, 2 Drawing Sheets

CRYSTAL FACE TEMPERATURE DETERMINATION MEANS

The invention described herein arose in the course: or under, contract No. DE-AC08-88NV10617 between the United States Department of Energy and E. G. & G. Energy Measurements, Inc.

BACKGROUND OF THE INVENTION

The present invention relates generally to a temperature measurement method and means, and more specifically to a non-invasive method for measuring the surface temperature of growing crystals.

Temperature is frequently an important parameter systems where materials are processed or their properties are to be measured. Many methods have been developed for measuring the temperature of solid or fluid phases of materials at both high and low temperatures. These methods may be classified as contact or non-contact methods. The contact methods (referred to as "invasive" methods) usually involve placing a sensor within or very close to the object to be measured, and then monitoring a temperature dependent property of the sensor, such as an electrical, optical, or geometrical property, or the like. It is generally essential for accurate measurements that the sensor disturbs the object as little as possible.

The non-contact ("non-invasive") methods of temperature measurement use a sensor which is remote from the object, and they measure a temperature dependent property of the object itself, such as the thermal (Planck) blackbody radiance, some feature of the optical spectrum, or the like. Methods which utilize the impingement of a probing beam onto an object to be measured in order to produce a measurable reflectance, absorption, or fluorescences response are, strictly speaking, invasive. However, particularly when photon beams are used as a probing beam, it is often possible to minimize the disturbance of the object by using a beam of very low intensity. The use of such a low intensity probe beam may be considered to be effectively nonintrusive.

In some situations, such as the growth of single crystals in various media, it is of interest to measure the temperature of the surface, as distinct from the bulk of a material. In several methods of crystal growth, a temperature gradient is established in a fluid medium to transport material or heat to or from a crystal which is growing in that medium. The thermal gradient normally extends into the crystal, so the surface and subsurface ("bulk") regions are at different temperatures. Since the quality of the crystal depends on controlling the temperatures of the crystal faces as they grow, it is the surface temperature which is of particular importance.

Many types of sensors are available for measuring the temperatures of solid or fluid phases in most situations, except that contact senors are not available for very high temperature measurement. However, contact sensors are usually inappropriate for measuring surface temperature because of their intrusive nature. The process of growing a single crystal of controlled composition and low defect content requires that precise control be maintained over the local thermal and composition fields at the surface of the crystal. A small disturbance of these fields can greatly affect the growth process. The presence of a sensor, however unobtrusive, can introduce disturbances such as contamination, mechanical damage to the growing crystal face, or alteration of the local temperature due to the thermal mass and conductivity of the sensor. For these reasons, non-invasive methods or photon probe methods with negligible impact are preferable in such cases, when they are available.

Single crystals of the tetragonal form of mercuric iodide ("$\alpha$-HgI$_2$") have several important applications, and the growth of such crystals are of particular interest to the present inventors. Particular problems are encountered in the growth of $\alpha$-HgI$_2$ crystals due to the softness of such crystals and their chemical reactivity with most sensors.

The best known method for avoiding sensors and measuring temperature non-invasively during the growth of crystals is radiation pyrometry. Radiation pyrometry is the measurement of the radiation which all objects emit continually in accordance with known physical laws of radiation. The characteristics of the radiation depend, in part, on the temperature of the object. Optical or infrared radiation pyrometries are useful over a wide temperature range, and by selecting a spectral range in which the object is opaque, the measurements can be said to pertain to the surface temperature. However, radiation pyrometry is not appropriate for monitoring the growth of $\alpha$-HgI$_2$ crystals. There is enough radiance at the growth temperatures of the $\alpha$-HgI$_2$ crystals to be measured by modern infrared sensing instruments, although the emissivity is relatively low in the infrared spectrum where the Planck radiation peak is located. However, because the crystal is transparent in this spectral range, the detected radiance represents the underlying bulk, as well as the surface, temperatures. Since the crystal during growth has a temperature gradient between its surface and interior, the analysis of its radiance will yield a depth-to-surface average temperature, rather than being specific to its surface. In a different situation, such as during annealing (where the crystal is isothermal), infrared radiation pyrometery could be useful, if the usual precautions are taken to eliminate background radiance transmitted through and reflected from the crystal. If the transparency problem is avoided by measuring the radiance at wavelengths below approximately 580 nm, at which frequency the $\alpha$-HgI$_2$ crystal is opaque, the intensity is immeasurably small at the temperatures of interest.

Clearly, it would be advantageous to provide a method which could accurately measure the surface temperature of growing $\alpha$-HgI$_2$ crystals by non-invasive methods. However, to the inventors' knowledge, no prior art method has successfully accurately measured the surface temperature of growing crystals, such as the $\alpha$-HgI$_2$ crystals, by non-invasive methods. All prior art successful methods for measuring the surface of such growing crystals have either been of an invasive type or else have measured temperatures which were not truly accurate surface temperatures when the crystals had a surface to bulk temperature gradient.

SUMMARY OF THE INVENTION

Accordingly, it is an object of the present invention to provide a method and means for accurately measuring the surface temperature of a growing crystal.

It is another object of the present invention to provide a method and means for measuring temperature which is effectively non-invasive.

It is still another object of the present invention to provide a method and means for measuring temperature which will accurately measure the surface temperature of α-HgI$_2$ crystals, and similar crystals, even when there is a surface to bulk temperature gradient in the crystal.

It is yet another object of the present invention to provide a method and means which will measure temperature to a high degree of accuracy.

It is still another object of the present invention to provide a method and means for measuring the surface temperature of a growing crystal which is simple to produce and which is reliable in operation.

Briefly, the preferred embodiment of the present invention is an evacuated ampule for growing a crystal therewithin according to methods which are known in the art, which methods include the controlling of temperature gradient between the crystal and the source material. In order to more accurately control the temperature gradient an accurate surface temperature determination of the surface of the crystal is made by directing a collimated beam of light at the crystal and determining the position of the excitonic peak in the reflection spectrum therefrom. The excitonic peak is a characteristic feature in the reflection spectrum of semiconductors, and its position is correlated to the surface temperature of the crystal according to an empirically derived linear equation.

An advantage of the present invention is that the surface temperature of growing crystals can be measured accurately.

A further advantage of the present invention is that is effectively non-invasive.

Yet another advantage of the present invention is that the temperature detected in the case of α-HgI$_2$ crystals is a surface temperature, as compared to a composite of surface and bulk temperature.

Still another advantage of the present invention that the temperature is detected to a high degree accuracy.

Yet another advantage of the present invention is that it is simple and reliable.

These and other objects and advantages of the present invention will become clear to those skilled in the art in view of the description of the best presently known mode of carrying out the invention and the industrial applicability of the preferred embodiment, as described herein and as illustrated in the several figures of the drawing.

DETAILED DESCRIPTION OF THE INVENTION

The best presently known mode for carrying out the invention is an optically transparent furnace and detector apparatus. The predominant expected usage of the optically transparent furnace including the inventive detector apparatus of the present invention is as a substitute for prior art furnaces including prior art temperature detection devices in crystal growing furnaces, particularly for the growth of α-HgI$_2$ crystals.

Figure 1:
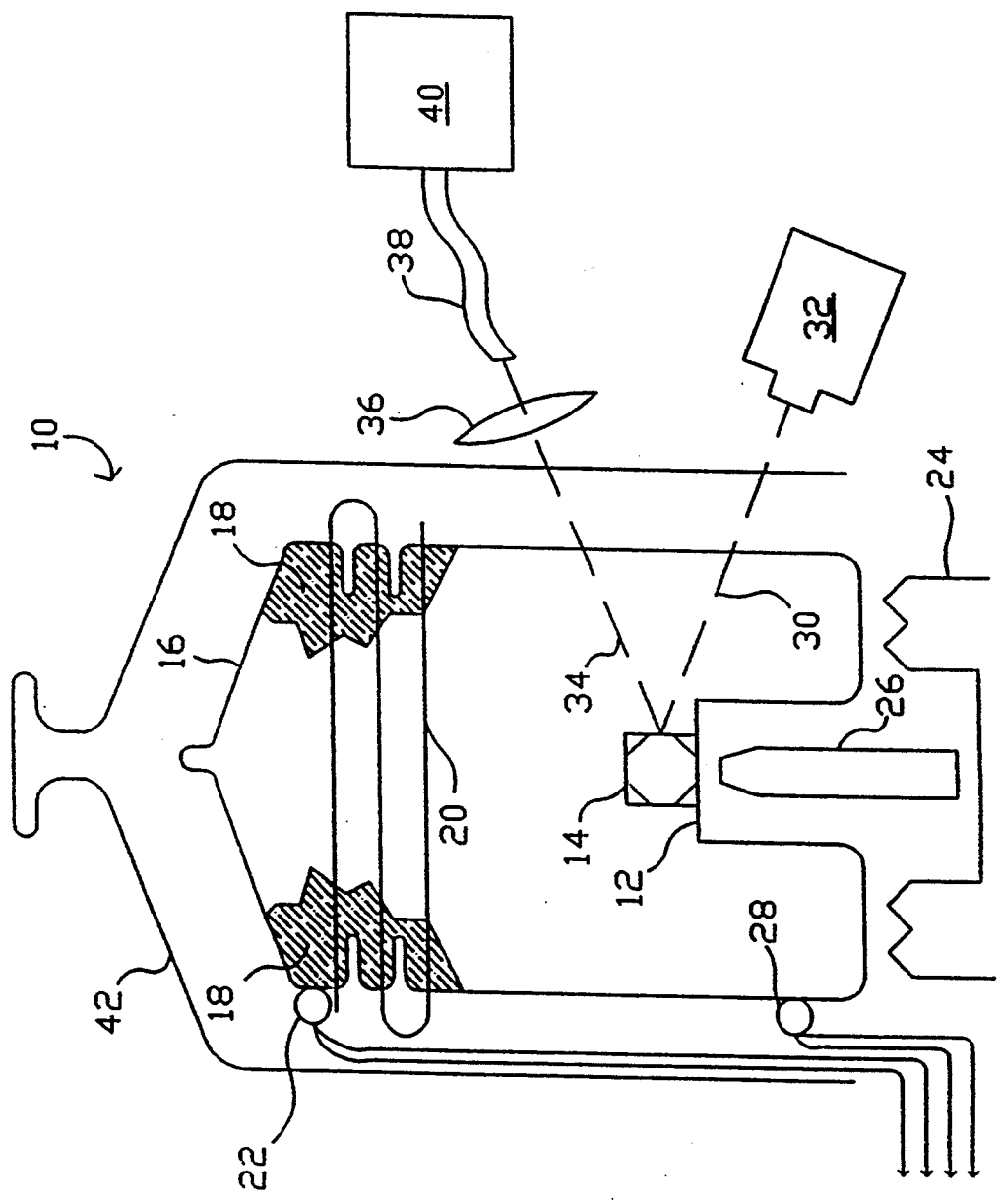
FIG. 1 is a diagram of an optically transparent furnace and detector apparatus according to the present invention.

An optically transparent furnace is shown in a diagrammatic elevational view in FIG. 1, and is designated therein by the general reference character 10. In many aspects, the optically transparent furnace is not unlike conventional crystal growing furnaces. In the best presently known embodiment 10 of the present invention, the crystal growing process is begun with a spontaneous nucleation obtained on a pedestal 12 with a seed to be grown into a crystal 14. The crystal 14 grows by transport of vapor along a temperature gradient in an evacuated ampule 16 from a polycrystalline source material 18 to the surface of the crystal 14, the surface of the crystal 14 being at a lower temperature than the source material 18.

The temperature gradient between the surface of the crystal 14 and the source material 18 determines the growth rate. This temperature gradient is established by a source heater 20, the source heater 20 being controlled by a source contact temperature sensor 22 touching the outside of the evacuated ampule 16, and by a base heater 24. Another aspect of the best presently known embodiment 10 of the present invention which will be familiar to one skilled in the art is a cold finger 26, which also affects the temperature gradient, although its primary purpose is to control the temperature profile of the pedestal 12. The base heater 24 is controlled by a base contact temperature sensor 28 outside the evacuated ampule 16, and the heat sink action of the cold finger 26 is a function of its clearance from the pedestal 12.

According to the method of the best presently known embodiment 10 of the present invention, reflection measurements were taken from the crystal 14 using an inventive detection apparatus 29 which provides a collimated, white light unpolarized beam 30 from a quartz halogen lamp 32, which produces a broad energy spectrum containing the range of present interest (2.0–2.3 eV). In the best presently known embodiment 10 of the present invention, the beam 30 has an intensity of 40 microwatts and produces a spot of approximately 4 mm diameter on the reflecting surface of the crystal 14. A reflected beam 34 is focused by a lens 36 onto an optical fiber 38 which carries the reflected beam 34 to a monochromator and photomultiplier detection spectrometer ("M/D") 40. In the best presently known embodiment 10 of the present invention, the M/D 40 employed is a commercially available SPEX TM 1403 0.85 meter double monochromator and photomultiplier detection spectrometer. Ambient lighting is kept at low levels during the measurements.

In the best presently known embodiment 10 of the present invention, an optically transparent outer housing 42 covers the evacuated ampule 16 for thermally isolating the evacuated ampule 16 from ambient temperature influences.

Calibration of the detection apparatus 29 has been accomplished using an isothermal oven (not shown) with the crystal 14 having faces larger than the diameter of the collimated beam 30. The evacuated ampule 16 was placed in the isothermal oven and the crystal 14 was established at various temperatures from 12° C. to 88° C. This range was limited at the high end because the vapor pressure of α-HgI$_2$ becomes high enough above 88° C. to produce significant evaporation from the crystal 14, which may result in loss of reflectance from the faces of the crystal 14 and loss of transparency of the evacuated ampule 16 due to crystallization of the vapor on the walls of the evacuated ampule 16 when calibration measurements are made while cooling the evacuated ampule 16. These problems do not occur within the calibration range just specified, or during the growing of the crystal 14 (even at temperatures above this calibration range) when appropriate temperature gradients are maintained within the evacuated ampule 16.

Figure 2:
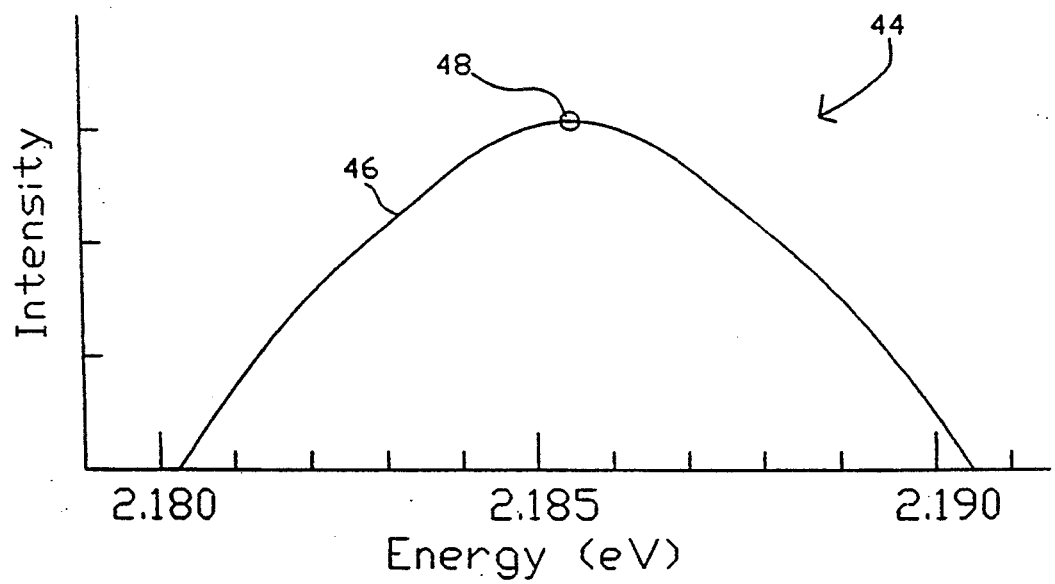
FIG. 2 is a graphic representation of an energy peak position.

Reflection measurements were made in successive, narrow energy intervals across the energy range of interest. The intensity of the reflected beam 34 has a broad but definite peak at some specific energy due to a fundamental process called an excitonic process. The specific energy of this peak is called the peak position and depends on the temperature. This is illustrated in FIG. 2, which is a graphic representation of an example of a reflected energy spectrum 44. An energy peak 46 is located at an energy peak position 48 of 2.1855 eV in the example of FIG. 2. A spectrum scanning increment of 5 cm$^{-1}$ and an integration time of 5 seconds proved to give satisfactory resolution, and measurements were taken for an overall measurement time of 25 minutes at each temperature.

Figure 3:
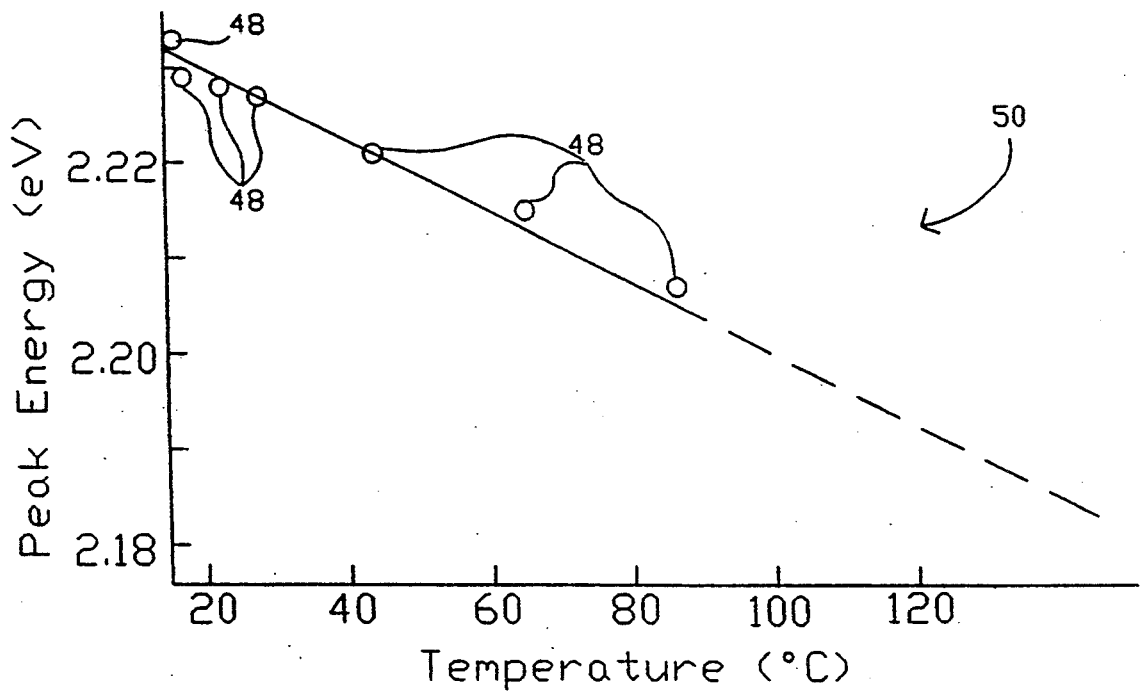
FIG. 3 is a calibration chart according to the present inventive method.

FIG. 3 is a calibration graph 50, where the excitonic peak positions 48, obtained from the several measurements as described above, are plotted as a function of temperature. The behavior over the calibration range was found to be linear. Similar behavior has been found in most semiconductor materials studied, in their higher temperature ranges. The peaks were broader and shallower at higher temperatures. The fitted linear function was calculated to be:

$$T = \frac{2.236 - E_r}{4.3 \times 10^{-4}}$$

where T is in degrees Celsius and $E_r$ is the measured peak positions 48 in units of electron volts. If this function is extrapolated to much lower temperatures, it predicts $E_r=2.318$ eV at $-198°$ C., which agrees very closely with the reported value of 2.320 eV. This agreement was used to verify and support the accuracy of the calibration. The inventors have found that the extrapolation of the fitted linear function into the growth range of 100° C. to 125° C. serves to accurately determine the surface temperature of the crystal 14 in the evacuated ampule 16 during growth of the crystal 14. Such temperature determination can then be coupled, by conventional means, to a heater controlling apparatus (not shown) to control the source heater 20 and the base heater 24 such that the desired temperature differential is maintained.

Various modifications may be made to the invention without altering its value or scope. For example, the crystal 14 being grown could be of a type other than the α-HgI$_2$ crystals for which the best presently known embodiment 10 of the present invention is intended. Indeed, many variations in the techniques for growing crystals which are known in the art or which might be developed in the future could be applied in conjunction with the present inventive method and means.

All of the above are only some of the examples available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The optically transparent furnace 10 including the inventive detector apparatus 29 is intended to replace conventional crystal growing apparatus using conventional temperature detection means, particularly in the growth of α-HgI$_2$ and similar crystals. The method described herein is especially applicable to semiconductors at comparatively low temperatures where excitonic reflection features are observable. Since the method is based on the spectral peak position, not the peak intensity, the usual experimental problems of variability in transparency of the optical elements or the experimental housing are avoided.

Using the above described extrapolation from the calibration results, the inventors have successfully measured the surface temperature of the growing crystal 14 to within an acceptable degree of accuracy, and it is anticipated that greater accuracy may be attained as the method is further developed. The inventors believe that the accuracy could be further improved by using longer integration times and multichannel detection.

The extent of surface heating of the crystal 14 by the collimated beam 30 has been approximated to be less than 0.3° C., so this method is effectively thermally non-invasive, within the accuracy of the measurement limits. The method is surface specific because the incident beam can only interact with the material within the penetration depth of the collimated beam 30. The penetration depth is given approximately by $3/\alpha$ where $\alpha$ is the absorption coefficient of the crystal 14. From absorption measurements in mercuric iodide, the penetration depth is on the order of a few micrometers in the spectral range of interest.

The optically transparent furnace 10 using the detector apparatus 29 and the associated method may be utilized in any application wherein conventional devices for crystal growth by vapor transport are used, and will provide improved control of the growing temperature, and thus improved crystal quality. Therefore, it is expected that it will be acceptable in the field as a substitute for the conventional crystal growing devices and as a retrofit method for determining the surface temperature of growing crystals in existing devices. For these and other reasons, it is expected that the utility and industrial applicability of the invention will be both significant in scope and long-lasting in duration.

We claim:

1. A method for determining the surface temperature of a growing crystal, comprising:
   directing a light beam at the growing crystal;
   directing a reflected portion of said light beam to an analysis unit;
   causing the analysis unit to determine an energy peak position of the reflected portion of said light beam, wherein;
   prior to directing said light beam at the growing crystal, said light beam is directed at a similar crystal of known surface temperature such that a correlation factor relating excitonic peak positions to temperatures is determined by said analysis unit.

2. The method of claim 1, wherein:
   said energy peak position is correlated to the surface temperature of the crystal.

3. The method of claim 1, wherein:
   the information of the energy peak position is used to control a plurality of heaters such that a desired temperature differential is maintained between the crystal and a polycrystalline source material.

4. The method of claim 1, wherein:
the crystal is grown in an optically transparent evacuated ampule.

5. The method of claim 1, wherein:
said analysis unit is a monochromator and photomultiplier detection spectrometer.

6. The method of claim 1, wherein:
the crystal is a mercuric iodide ("α-HgI$_2$") crystal.

7. The method of claim 1, wherein:
said light beam is a collimated white light beam.

* * * * *